(12) United States Patent
Karjalainen et al.

(10) Patent No.: US 7,035,601 B2
(45) Date of Patent: Apr. 25, 2006

(54) DATA TRANSMISSION METHOD, BASE STATION AND TRANSMITTER FOR COMPENSATING FOR NON-LINEARITIES IN A TRANSMISSION CHAIN

(75) Inventors: Miia Karjalainen, Oulu (FI); Samu Saarinen, Oulu (FI); Kauko Heinikoski, Kempele (FI); Teemu Tolonen, Oulu (FI); Juha Ylinen, Oulu (FI); Jani Suonperä, Oulu (FI); Risto Lehtinen, Mouans-Sartoux (FR)

(73) Assignee: Nokia Corporation, Espoo (FI)

( * ) Notice: Subject to any disclaimer, the term of this patent is extended or adjusted under 35 U.S.C. 154(b) by 424 days.

(21) Appl. No.: 10/630,975

(22) Filed: Jul. 31, 2003

(65) Prior Publication Data

US 2004/0171358 A1  Sep. 2, 2004

Related U.S. Application Data

(60) Provisional application No. 60/449,848, filed on Feb. 27, 2003.

(51) Int. Cl.
*H04B 1/04*   (2006.01)
(52) U.S. Cl. .................... 455/114.3; 375/297
(58) Field of Classification Search ............ 455/114.2, 455/114.3, 126, 127.1; 375/296, 297; 330/149
See application file for complete search history.

(56) References Cited

U.S. PATENT DOCUMENTS

| | | | |
|---|---|---|---|
| 5,252,930 A | 10/1993 | Blauvelt | |
| 6,587,514 B1 * | 7/2003 | Wright et al. | 375/296 |
| 2002/0127986 A1 * | 9/2002 | White et al. | 455/194.2 |
| 2003/0179831 A1 * | 9/2003 | Gupta et al. | 375/296 |
| 2003/0184372 A1 | 10/2003 | Fudaba et al. | |

FOREIGN PATENT DOCUMENTS

| | | |
|---|---|---|
| EP | 1 085 668 A2 | 3/2001 |
| WO | WO 01/08294 A1 | 2/2001 |

* cited by examiner

*Primary Examiner*—Nguyen T. Vo
(74) *Attorney, Agent, or Firm*—Squire, Sanders & Dempsey L.L.P.

(57) ABSTRACT

A transmitter compensates for the non-linearities within a transmission chain. The transmitter includes, for instance, a first forming device for forming, on the basis of at least one set of signal properties, at least one state expansion vector comprising quantities characterizing a signal. The transmitter includes a modifier for modifying the signal characterizing quantities of at least one state expansion vector with the at least one time-domain compensation parameter vector and with the at least one frequency-domain compensation parameter vector to form a pre-distorted signal. The transmitter includes a second forming device for forming a feedback signal from an output signal of a transmission chain. The transmitter includes an adapter for adapting at least one time-domain compensation parameter vector for adapting at least one frequency-domain compensation parameter vector based on a residual error between a transmit signal and the feedback signal.

23 Claims, 5 Drawing Sheets

DATA TRANSMISSION METHOD, BASE STATION AND TRANSMITTER FOR COMPENSATING FOR NON-LINEARITIES IN A TRANSMISSION CHAIN

CROSS-REFERENCE TO RELATED APPLICATIONS

This application claims priority to U.S. Provisional Patent Application Ser. No. 60/449,848 entitled, "Data Transmission Method, Base Station and Transmitter," filed Feb. 27, 2003, the entire contents of which are incorporated herein by reference.

BACKGROUND OF THE INVENTION

1. Field of the Invention

The invention relates to a data transmission method, a base station and a transmitter in a telecommunication system.

2. Description of the Related Art

Power amplifiers are required in radio telecommunication systems to amplify signals before transmitting the signal, because a radio signal attenuates on the radio path. Unfortunately, high-power radio-frequency amplifiers tend to be non-linear devices and therefore they in many cases cause distortion. This distortion is expressed, for example, as Inter-Symbol-Interference or out-off-band power in adjacent frequency bands. ACLR (Adjacent Carrier Leakage Ratio) quantifies the out-off-band transmitted power and thus it must remain within specified limits.

In the prior art, there are several different methods to compensate for non-linearity of power amplifiers. Compensation of power amplifier non-linearities can be classified into three main categories: feedback, feed-forward and pre-distortion. Pre-distortion is often called pre-emphasizing.

The feedback technique is especially used in audio amplifiers. However, feedback control on radio-frequencies becomes difficult because of realtime feedback circuit implementation. A linearized multicarrier power amplifier has also been proposed. It utilizes Cartesian feedback. This technique is not applicable to wide-band transmitters, due to its rather narrow frequency band.

In the case of linearization of wide-band applications, such as WCDMA (Wideband Code Division Multiple Access), feed-forward is most commonly used in the prior art. In a feed-forward amplifier, the distortion or error signal produced in the amplifier is detected by comparing the input and output signals. The detected error signals are fed into a linear sub-amplifier to amplify them to the same level as that of the power amplifier. The amplified error signal is then subtracted from the output of the power amplifier. The problem is that the linearity of the sub-amplifier must be high and this can decrease the overall power efficiency.

In a pre-distorter amplifier, a pre-distorter adds a pre-distorting signal to an input signal in advance to cancel the distortion generated in amplifiers. The problem is that the compensating performance deteriorates if the amplifier parameters deviate from the designed values.

There are prior-art solutions for adapting a pre-distorter amplifier. The problem in the prior-art solutions is, however, that the linearization of distorted signals is inadequate. Typically pre-distortion parameters are stored in a look-up table, but this approach easily enlarges the memory size and creates quantization noise, because parameter values typically differ from each other by predetermined steps.

SUMMARY OF THE INVENTION

One objective of the invention is to provide an improved method to compensate for distortion caused by non-linear devices in the transmission chain such as power amplifiers. According to one embodiment of the invention, a data transmission method for compensating for non-linearities of a transmission chain is provided. The method comprises the steps of forming at least one time-domain compensation parameter vector, forming at least one frequency-domain compensation parameter vector, determining at least one set of signal properties modeling the non-linearities in a transmission chain, forming, based on the at least one set of signal properties, at least one state expansion vector comprising quantities characterizing a signal, modifying the signal characterizing quantities of at least one state expansion vector with the at least one time-domain compensation parameter vector and with the at least one frequency-domain compensation parameter vector to form a pre-distorted signal, forming a feedback signal from an output signal of a transmission chain, adapting the at least one time-domain compensation parameter vector based on a residual error between a transmit signal and the feedback signal, adapting the at least one frequency-domain compensation parameter vector based on the residual error between the transmit signal and the feedback signal.

The invention also relates to a data transmission method for compensating for non-linearities of a transmission chain, the method comprising: forming at least one time-domain compensation parameter vector, forming at least one frequency-domain compensation parameter vector, determining at least one set of signal properties modeling the non-linearities in a transmission chain, forming, based on the at least one set of signal properties at least one state expansion vector comprising quantities characterizing a signal, modifying the signal characterizing quantities of at least one state expansion vector with the at least one time-domain compensation parameter vector and with the at least one frequency-domain compensation parameter vector to form a pre-distorted signal, forming a feedback signal from an output signal of a transmission chain, filtering the feedback signal to minimize a non-linear frequency response of a feedback chain, adapting the at least one time-domain compensation parameter vector based on a residual error between a transmit signal and the feedback signal, adapting the at least one frequency-domain compensation parameter vector based on the residual error between the transmit signal and the feedback signal, adapting at least one compensation parameter vector of a feedback filter based on the residual error between the transmit signal and the feedback signal.

The invention also relates to a transmitter for compensating for the non-linearities of a transmission chain, the transmitter comprising: first forming means for forming at least one time-domain compensation parameter vector, second forming means for forming at least one frequency-domain compensation parameter vector, determining means for determining at least one set of signal properties modelling the non-linearities in a transmission chain, third forming means for forming, based on the at least one set of signal properties, at least one state expansion vector comprising quantities characterizing a signal, modifying means for modifying the signal characterizing quantities of at least one state expansion vector with the at least one time-domain compensation parameter vector and with the at least one frequency-domain compensation parameter vector to form a pre-distorted signal, fourth forming means for forming a feedback signal from an output signal of a transmission chain, first adapting means for adapting the at least one time-domain compensation parameter vector based on a residual error between a transmit signal and a feedback signal, second adapting means for adapting the at least one frequency-domain compensation parameter vector based on the residual error between the transmit signal and the feedback signal.

The invention also relates to a transmitter for compensating for non-linearities of a transmission chain, the transmitter comprising: first forming means for forming at least one time-domain compensation parameter vector, second forming means for forming at least one frequency-domain compensation parameter vector, determining means for determining at least one set of signal properties modeling the non-linearities in a transmission chain, third forming means for forming, based on the at least one set of signal properties, at least one state expansion vector comprising quantities characterizing a signal, modifying means for modifying the signal characterizing quantities of at least one state expansion vector with the at least one time-domain compensation parameter vector and with the at least one frequency-domain compensation parameter vector to form a pre-distorted signal, fourth forming means for forming a feedback signal from an output signal of a transmission chain, filtering means for filtering the feedback signal to minimize the non-linear frequency response of a feedback chain, first adapting means for adapting the at least one time-domain compensation parameter vector based on a residual error between a transmit signal and the feedback signal, second adapting means for adapting the at least one frequency-domain compensation parameter vector based on the residual error between the transmit signal and the feedback signal, and third adapting means for adapting at least one compensation parameter vector of a feedback filter based on the residual error between the transmit signal and the feedback signal.

The invention also relates to a transmitter for compensating for non-linearities of a transmission chain, the transmitter being configured to: form at least one time-domain compensation parameter vector, form at least one frequency-domain compensation parameter vector, determine at least one set of signal properties modeling the non-linearities in a transmission chain, form, based on the at least one set of signal properties, at least one state expansion vector comprising quantities characterizing a signal, modify the signal characterizing quantities of at least one state expansion vector with the at least one time-domain compensation parameter vector and with the at least one frequency-domain compensation parameter vector to form a pre-distorted signal, form a feedback signal from an output signal of a transmission chain, adapt the at least one time-domain compensation parameter vector based on a residual error between a transmit signal and the feedback signal, adapt the at least one frequency-domain compensation parameter vector based on the residual error between the transmit signal and the feedback signal.

The invention also relates to a transmitter for compensating for non-linearities of a transmission chain, the transmitter being configured to: form at least one time-domain compensation parameter vector, form at least one frequency-domain compensation parameter vector, determine at least one set of signal properties modeling the non-linearities in a transmission chain, form, based on the at least one set of signal properties, at least one state expansion vector comprising quantities characterizing a signal, modify the signal characterizing quantities of at least one state expansion vector with the at least one time-domain compensation parameter vector and with the at least one frequency-domain compensation parameter vector to form a pre-distorted signal, form a feedback signal from an output signal of a transmission chain, filter the feedback signal to minimize a non-linear frequency response of a feedback chain, adapt the at least one time-domain compensation parameter vector based on a residual error between a transmit signal and feedback signal, adapt the at least one frequency-domain compensation parameter vector based on the residual error between the transmit signal and the feedback signal, adapt at least one coefficient of a feedback filter based on the residual error between the transmit signal and the feedback signal.

The invention also relates to a base station, wherein non-linearities of a transmission chain are compensated for, the base station comprising: first forming means for forming at least one time-domain compensation parameter vector, second forming means for forming at least one frequency-domain compensation parameter vector, determining means for determining at least one set of signal properties modeling the nonlinearities in a transmission chain, third forming means for forming, based on the at least one set of signal properties at least one state expansion vector comprising quantities characterizing a signal, modifying means for modifying the signal characterizing quantities with the at least one time-domain compensation parameter vector and with the at least one frequency-domain compensation parameter vector to form a pre-distorted signal, fourth forming means for forming a feedback signal from a transmission chain output signal, first adapting means for adapting the at least one time-domain compensation parameter vector based on a residual error between a transmit signal and the feedback signal, second adapting means for adapting the at least one frequency-domain compensation parameter vector based on the residual error between the transmit signal and the feedback signal.

The invention also relates to a base station, wherein nonlinearities of a transmission chain are compensated for, the base station comprising: first forming means for forming at least one time-domain compensation parameter vector, second forming means for forming at least one frequency-domain compensation parameter vector, determining means for determining at least one set of signal properties modeling the nonlinearities in a transmission chain, third forming means for forming, based on the at least one set of signal properties, at least one state expansion vector comprising quantities characterizing a signal, modifying means for modifying the signal characterizing quantities with the at least one time-domain compensation parameter vector and with the at least one frequency-domain compensation parameter vector to form a pre-distorted signal, fourth forming means for forming a feedback signal from an output signal of a transmission chain, filtering means for filtering the feedback signal to minimize a non-linear frequency response of a feedback chain, first adapting means for adapting the at least one time-domain compensation parameter vector based on a residual error between a transmit signal and the feedback signal, second adapting means for adapting the at least one frequency-domain compensation parameter vector based on the residual error between the transmit signal and the feedback signal, third adapting means for adapting at least one compensation parameter vector of a feedback filter based on the residual error between the transmit signal and the feedback signal.

The method and system of the invention provide several advantages. For instance, in lookup tables (LUT) used in the prior-art solutions each entry is an independent variable. As the dimensions of the distortion model increase, the dimensions of the variable space grow exponentially which makes a high-dimensional model very difficult to implement in practice, because the number of adaptation rounds increase. A preferred embodiment of the invention enables the use of higher-dimensional models which can better follow the changes in the system. A preferred embodiment of the invention allows utilization of a larger number of model features compared to the prior-art solutions, while keeping the number of independent variables low.

In addition, another preferred embodiments of the invention further improves the linearization, because the frequency domain distortion which usually appears in analogue circuits is also compensated.

BRIEF DESCRIPTION OF THE DRAWINGS

In the following, the invention will be described in greater detail with reference to the preferred embodiments and the accompanying drawings, in which.

DETAILED DESCRIPTION OF THE PREFERRED EMBODIMENTS

Figure 1:
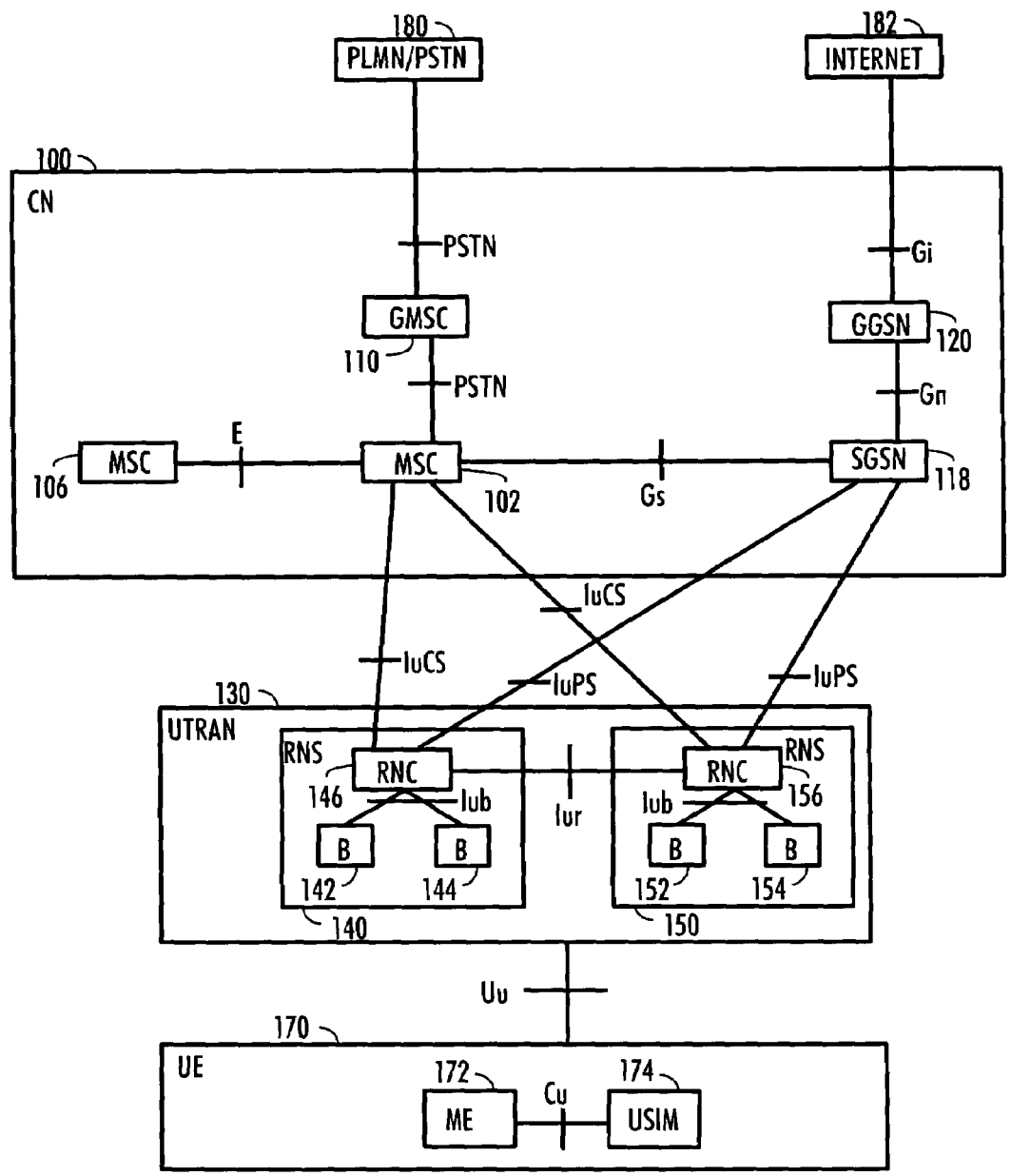
FIG. 1 shows a simplified example of a telecommunication system in accordance with an embodiment of the invention.

With reference to FIG. 1, an example of a data transmission system in which the preferred embodiments of the invention can be applied is shown. In FIG. 1, the embodiment is described in a simplified radio system, which represents, for example, a Code Division Multiple Access, (CDMA), system. The Code Division Multiple Access technique is used nowadays for example in radio systems which are known at least by the names IMT-2000 (International Mobile Telecommunications 2000) and UMTS (Universal Mobile Telecommunications System). The embodiments are not, however, restricted to these systems given as examples but a person skilled in the art may apply the solution to other radio systems provided with the necessary properties.

FIG. 1 is a simplified block diagram, which describes the most important network elements of the radio system and the interfaces between them. The structure and function of the network elements are not described in detail because they are generally known.

The main parts of the radio system are a core network (CN) 100, a radio access network 130 and user equipment (UE) 170. The term UTRAN is an abbreviation from UMTS Terrestrial Radio Access Network, i.e. the radio access network belongs to the third generation and is implemented by wideband code division multiple access (WCDMA). Generally, the radio system can also be defined as follows: the radio system consists of a user terminal, which is also called a subscriber terminal or a mobile station, and of a network part, which includes the fixed infrastructure of the radio system, i.e. a core network, a radio access network and a base station system.

A mobile services switching center (MSC) 102 is the center of the circuit-switched side of the core network 100. The mobile services switching center 102 is used to serve as the connections of the radio access network 130. The tasks of the mobile services switching center 102 typically include switching, paging, user terminal location registration, handover management, collection of subscriber billing information, data encryption parameter management, frequency allocation management and echo cancellation.

The number of mobile services switching centers 102 may vary. For instance, a small network operator may have only one mobile services switching center 102, whereas large core networks 100 may have several. FIG. 1 shows another mobile services switching center 106 but its connections to other network elements are not illustrated to keep FIG. 1 sufficiently clear.

Large core networks 100 may comprise a separate gateway mobile services switching center (GMSC) 110 which is responsible for circuit-switched connections between the core network 100 and the external networks 180. The gateway mobile services switching center 110 is located between the mobile services switching centers 102, 106 and the external networks 180. The external network 180 may be, for example, a public land mobile network PLMN or a public switched telephone network PSTN.

The core network 100 typically comprises other parts, too, such as a home location register (HLR), which includes a permanent subscriber register and, if the radio system supports GPRS, a Packet Data Protocol (PDP) address, and a visitor location register (VLR), which includes information on the roaming of the user terminals 170 in the area of the mobile services switching center 102. Not all the parts of the core network are shown in FIG. 1 to keep it clear.

A serving GPRS support node (SGSN) 118 is the center of the packet-switched side of the core network 100. One of the main tasks of the serving GPRS support node 118 is to transmit and receive packets with the user terminal 170 supporting packet-switched transmission by utilizing the radio access network 130. The serving GPRS support node 118 includes user information and location information on the user terminal 170.

A gateway GPRS support node (GGSN) 120 on the packet-switched side corresponds to the gateway mobile services switching center 110 of the circuit-switched side, with the exception that the gateway GPRS support node 120 has to be able to route outgoing traffic from the core network 100 to external networks 182, whereas the gateway mobile services switching center 110 routes only the incoming traffic. In the example, the external networks 182 are represented by the Internet, via which a considerable part of wireless telephone traffic can be transmitted in the future.

The radio access network 130 consists of radio network subsystems 140, 150. Each radio network subsystem 140, 150 consists of radio network controllers (RNC) 146, 156 and B nodes 142, 144, 152, 154. The term B node represents a "base station."

The radio network controller 146, 156 is usually responsible for the following tasks, for example: management of the radio resources of the base transceiver station or B-node 142, 144, 152, 154, intercell handover, measurement of time delays on the uplink, implementation of the operation and management interface, and management of power control.

The radio network controller 146, 156 includes at least one transceiver. One radio network controller 146, 156 may serve one cell or several sectorized cells. The cell diameter may vary from a few meters to many of kilometers. The radio network controller 146, 156 is often deemed to include a transcoder, too, for performing conversion between the speech coding format used in the radio system and the speech coding format used in the public switched telephone system. In practice the transcoder, however, is usually located in the mobile services switching center 102. The radio network controller 146, 156 is usually responsible for the following tasks, for example: measurements on the uplink, channel coding, encryption and scrambling coding.

The user terminal 170 consists of two parts: mobile equipment (ME) 172 and a UMTS subscriber identity module (USIM) 174. The user terminal 170 comprises at least one transceiver for establishing a radio connection to the radio access network 130. The user terminal 170 may include at least two different subscriber identity modules. In addition, the user terminal 170 comprises an antenna, a user interface and a battery. Nowadays various kinds of user terminals 170 are available, for instance terminals that are installed in a car and portable terminals. The user terminals 170 also have properties similar to those of a personal computer or a portable computer.

USIM 174 includes information on the user and information on data security, for instance an encryption algorithm, in particular.

It is obvious to a person skilled in the art that the interfaces included in the radio telecommunication system are determined by the hardware implementation and the standard used, for which reason the interfaces of the system may differ from those shown in FIG. 1. In UMTS, the most important interfaces are the Iu interface between the core network and the radio access network, which is divided into the IuCS (CS=Circuit Switched) interface of the circuit-switched side and the IuPS (PS=Packet Switched) interface of the packet-switched side, and the Uu interface between the radio access network and the user terminal. The interface defines what kind of messages different network elements may use to communicate with one another. The object of the standardization of interfaces is to enable operation between network elements of different producers. In practice, however, some of the interfaces are producer-specific.

Figure 2:
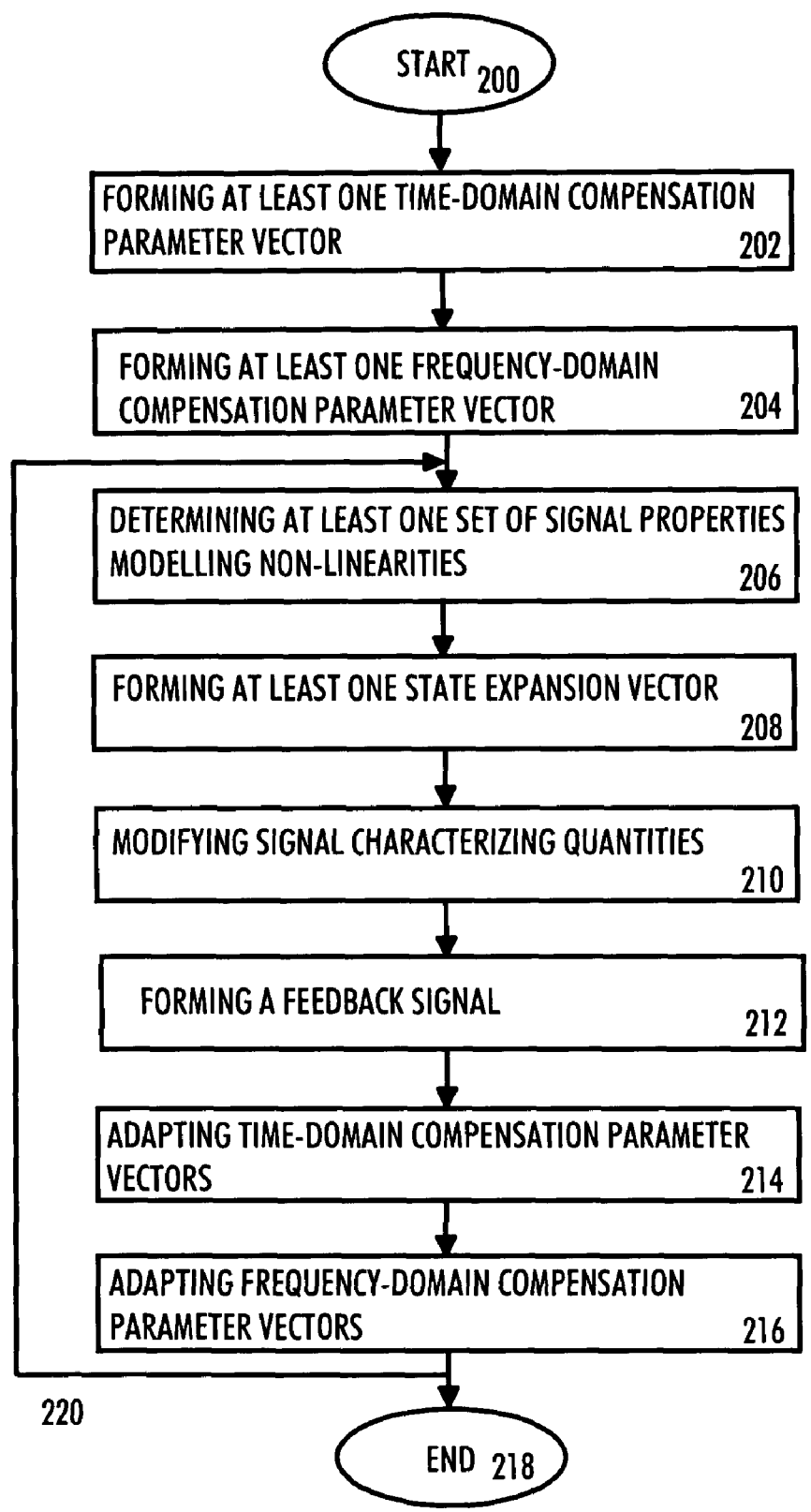
FIG. 2 is a flow chart of a method for compensating for non-linearities of a transmission chain according to an embodiment of the invention.

FIG. 2 shows a flow chart of a preferred embodiment of a method to carry out digital pre-distortion or pre-emphasis according to the invention. One objective of the method is to compensate for the nonlinearities of a transmission chain. Briefly, typically linearization is carried out by adding a pre-distortion signal to a modulated base band signal, thereby compensating for wide band distortion at the output of the nonlinear device. The method is especially suitable to compensate for signal nonlinearities caused by power amplifiers in transmitters.

A power amplifier has three main requirements: high output power, high efficiency and low distortion. Designing a power amplifier is typically a trade-off among these requirements. A non-linear high-efficiency amplifier distorts both the amplitude and phase of a signal. Non-linearity also causes inter-modulation distortion and spectral re-growth. These cause adjacent channel interference due to which network performance deteriorates. A transmit chain comprising a power amplifier also introduces non-linear frequency transfer functions. On the other hand, a linear amplifier has a low efficiency which causes reduced reliability, increased costs and increase in heat production.

Linearization is typically required to suppress adjacent channel leakage power (ACP) to a predefined level determined by a system specification. The method is used particularly when high transmission powers are needed.

Attention should be paid to the fact that, in the method signal, values are preferably represented in a polar coordinate system, because it typically gives more accurate results. It also enables the invention to process signals in real format instead of complex values.

The method starts in block 200. In block 202, at least one time-domain compensation parameter vector is formed. A parameter vector may be include one or more sub-vectors, each associated with a specific signal characteristic related to the non-linearity of a power amplifier.

A parameter vector (function) determines a polynomial, a spline or any other function by giving its coefficients. In this application, vector also means a matrix type vector. A spline can be characterized as a function that is a polynomial on each of a given set of subintervals in its domain. A spline is also smooth at the boundaries of the subintervals. A time-domain compensation parameter vector is used for time domain pre-distortion.

Usually functions (or vectors) can better depict the complicated effects caused by non-linearity than using individual values, mainly because the size of a memory (in the prior-art, look-up tables are used) must be limited for the sake of practicality. Usually several vectors are required, because the use of various vectors produces a more accurate result. The number of selected vectors as well as the vectors themselves depend on the typical radio conditions of the system and naturally on the desired accuracy of the compensation. The following four functions are typically used: memoryless, dynamic, weighted integral dynamic and cross-term dynamic pre-distortion function. The difference between these functions can be explained as follows. The memoryless pre-distortion function uses sampled amplitude values. The dynamic pre-distortion function also utilizes previous amplitude values and can therefore better predict the direction of future changes. The integral pre-distortion function uses a longer examination time period than the dynamic pre-distortion function. By utilizing a longer examination time period, changes due to temperature variation in a response of a non-linear device can be tracked. The cross-term dynamic pre-distortion function utilizes memoryless, dynamic and integral functions. It typically multiplies values defined by these functions. In other words, the cross-term function is formed by combining the outputs of other blocks in an appropriate manner.

In block 204, at least one frequency-domain parameter vector (or function) is formed. Theoretically, impairments caused by nonlinearity can be cancelled by applying to the transmission signal the inverse of the nonlinearities transfer function. In practice, however, there are always frequency-domain errors in addition to time-domain errors and thus also a frequency-domain pre-distortion is required. The frequency compensation parameter vector is preferably formed by analyzing the transmit and feedback signals and adapting inverse filtering on the basis of the results. In block 206, at least one set of signal properties modeling the nonlinearities in a transmit chain are determined. Typically, some of the properties of the signal used in the invention may include the amplitude, phase or frequency. In many cases, one set of signal properties is enough, but sometimes more sets may be required to give a more accurate result. The nonlinearities of the transmit chain are modeled to determine the parameters for forming a state expansion vector in block 208.

In block 208, at least one state expansion vector is formed based on at least one set of signal properties. A state expansion vector consists of quantities characterizing non-linearities as a function of selected signal properties. For instance, a state expansion vector is composed of a predetermined number of amplitude values of different powers which are arranged in a vector. Another example is that a state expansion vector is composed of a predetermined number of amplitude derivates. Yet another example is that a state expansion vector is formed from amplitude values which are processed in different ways: by differentiating, integrating, etc. It is also possible to combine amplitude values processed in different ways. Therefore, a state expansion vector can be composed of one or more amplitude values, one or more derived amplitude values, one or more integrated amplitude values and/or combined values which can be called cross terms.

The number of required state expansion vectors varies: sometimes a good result can be obtained by using only one vector, but for more complicated situations more vectors may be needed. The length of a state expansion vector depends on the requirements of pre-distortion. In other words, the number of terms depends on the needed quality of pre-distortion. Sometimes a good result can be obtained by using a short vector, but for more complicated situations the length of a vector can be increased.

Based on a frequency, bandwidth, power or another transmit chain variable, it is possible to use different settings within a state expander and to select different compensation parameter sets for both time- and frequency-domain pre-distortion.

In block 210, signal characterizing quantities are modified with at least one time-domain compensation parameter vector and with at least one frequency-domain compensation parameter vector to form a pre-distorted signal. Time-domain modification is typically done by multiplying predetermined signal characterizing quantities of one or more state expansion vectors with selected parameters of one or more time-domain compensation parameter vectors. Typically, the quantities multiplied are the amplitude and/or phase parameters. In a preferred embodiment of the invention, the time-domain pre-distortion is performed in a polar co-ordinate system. After time-domain compensation compensated parameters are combined in order to get one value per each parameter, for example, one phase value and one amplitude value per original data value.

The frequency-domain compensation is preferably performed by filtering a time-domain pre-emphasized signal value. The compensation filter structure typically comprises one or more filters or filter banks for compensating the non-linearities of a frequency response. This distortion is compensated by a filter. The frequency response of which is intended to be a mirror-image is compared with a transmission chain. The purpose is to linearize the frequency response of a transmission chain. In principle, the frequency response of the transmission chain can be equalized by forming an inverse filter by comparing the error between the transmit and feedback signals. Typically, a state expander controls the behavior and properties of the frequency domain predistortion.

If there is no need for frequency-domain compensation, the filter tap coefficients can be set to the value 1.

In block 212, a feedback signal forms a transmission chain output signal. This is typically done by using a feedback chain which is composed of an analog-to digital converter and other required functions. The feedback signal is needed for adaptation in block 214 and 216.

In block 214, one or more time-domain compensation parameter vectors are adapted on the basis of the residual error between the transmit and feedback signals. Preferably, for this purpose, the signal values are fed back. Signal values of a feedback signal and the original data signal values are compared and on the basis of the result, the compensation parameter vectors are adapted by changing coefficients. In a preferred embodiment, the adaptation is performed using a polar co-ordinate system.

In block 216, one or more frequency-domain compensation parameter vectors are adapted on the basis of the residual error between the transmit and feedback signals. Preferably, for this purpose, the signal values are fed back for adapting the compensation filter structure. Signal values after a power amplifier and the original data signal values are compared and on the basis of the result, the filter tap coefficients are determined to adjust the filter to better compensate frequency-domain distortion.

The method ends in block 218. The arrow 220 illustrates that the process may be iterative.

Figure 3:
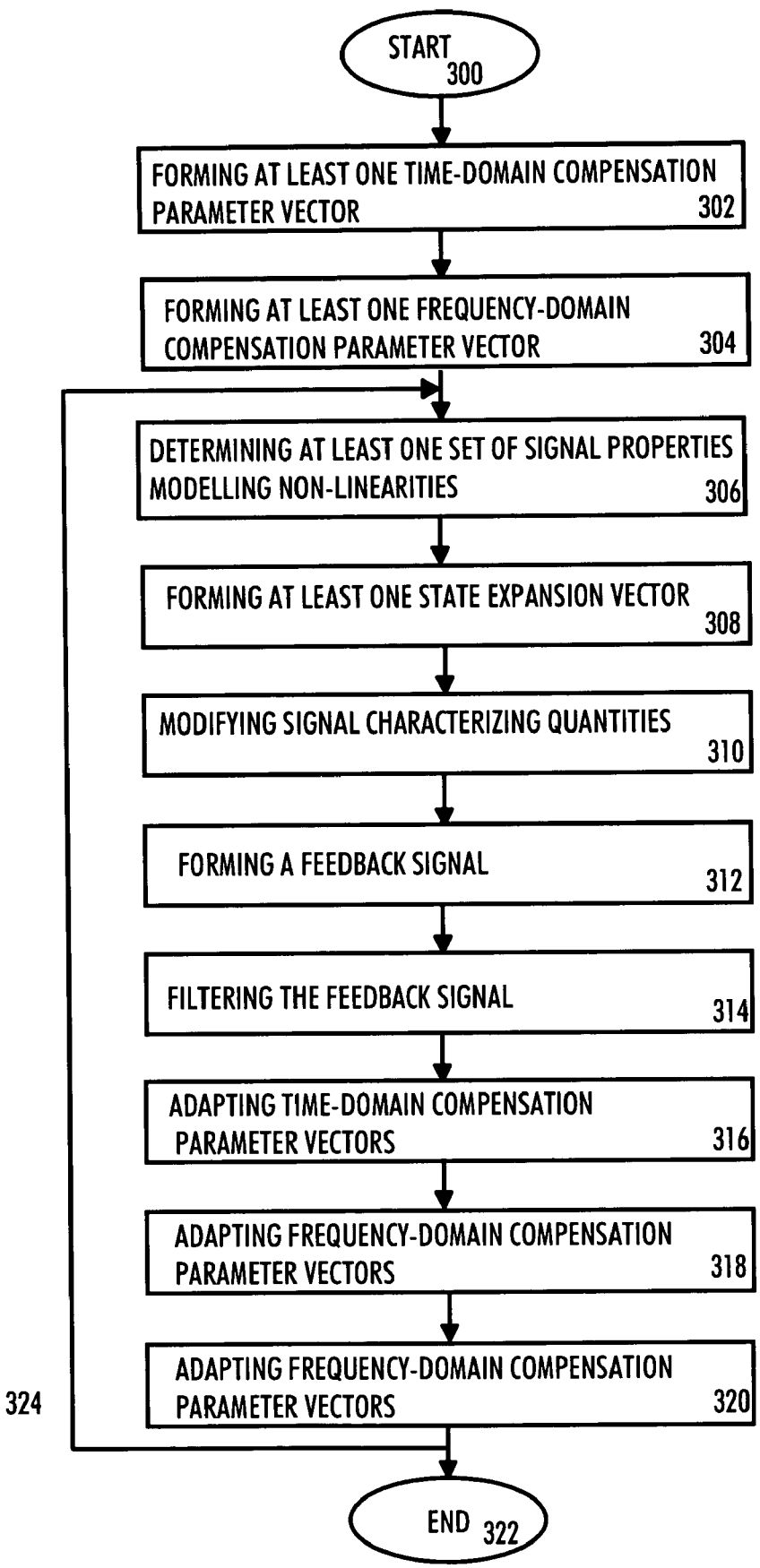
FIG. 3 is another flow chart of a method for compensating for non-linearities of a transmission chain according to an embodiment of the invention.

FIG. 3 shows a flow chart of another preferred embodiment of a method implementing digital pre-distortion according to an embodiment of the invention. This embodiment of the method utilizes more filtering. The second filtering is used to compensate for frequency-dependent non-linearities originated in a down-conversion chain. It is also possible to implement the filter structure with one or more filters or filter banks depending on the system. This is preferably done by comparing the signal values of a feedback signal with the original data signal values and by determining filter tap coefficients on the basis of the result.

The method starts in block 300. In block 302, at least one time-domain compensation parameter vector is formed. A parameter vector may be thought to consists of one or more sub-vectors, each associated with a specific signal characteristic causing the non-linearity of a power amplifier. In this application, vector also means matrix type vectors.

A parameter vector (function) determines a polynomial, a spline or any other function by giving its coefficients. A spline can be characterized as a function that is a polynomial on each of a given set of subintervals in its domain. A spline is also smooth at the boundaries of the subintervals. A time-domain compensation parameter vector is used for time-domain pre-distortion.

Usually functions (or vectors) can better depict the complicated effects caused by non-linearity than using individual values, mainly because the size of a memory (in the prior-art, look-up tables are used) must be limited for the sake of practicality. Usually several vectors are required, because the use of various vectors produces a more accurate result. The number of selected vectors as well as the vectors themselves depend on the typical radio conditions of the system and naturally on the desired accuracy of the compensation. The following four functions are typically used: memoryless, dynamic, weighted integral dynamic and cross-term dynamic pre-distortion function. The difference between these functions can be explained as follows. The memoryless pre-distortion function utilizes sampled amplitude values. The dynamic pre-distortion function also utilizes previous amplitude values and can therefore better predict the direction of future changes. The integral pre-distortion function uses a longer examination time period than the dynamic pre-distortion function. By utilizing a longer examination time period, changes due to temperature variations in a response of a non-linear device can be tracked. The cross-term dynamic pre-distortion function utilizes memoryless, dynamic and integral functions. It typically multiplies values defined by these functions. In other words, the cross-term function is formed by combining the outputs of other blocks in an appropriate manner.

In block 304, at least one frequency-domain parameter vector (or function) is formed. Theoretically, impairments caused by non-linearity can be cancelled by applying to the transmission signal the inverse of the non-linearities transfer function. In practice, however, there are always frequency-domain errors in addition to time-domain errors and thus also a frequency-domain pre-distortion is required. The frequency compensation parameter vector is preferably formed by analyzing the frequency responses of determined signals and adapting inverse filtering on the basis of the results.

In block 306, at least one set of signal properties modeling the non-linearities in a transmit chain are determined. Typically, the properties of the signal used include the amplitude, phase or frequency. In many cases, one set of signal properties is enough, but sometimes more sets may be required to give a more accurate result. The non-linearities of the transmit chain are modeled to determine the parameters for forming a state expansion vector in block 308.

In block 308, at least one state expansion vector is formed based on at least one set of signal properties. A state expansion vector consists of quantities characterizing non-linearities as a function of selected signal properties. For instance, a state expansion vector is composed of a predetermined number of amplitude values of different powers which are arranged in a vector. Another example is that a state expansion vector is composed of a predetermined number of amplitude derivates. Yet another example is that a state expansion vector is formed from amplitude values which are processed in different ways: by deriving, integrating etc. It is also possible to combine amplitude values processed in different ways. Therefore, a state expansion vector can be composed of one or more amplitude values, one or more derived amplitude values, one or more integrated amplitude values and/or combined values, which can be called cross terms.

The number of required state expansion vectors varies: sometimes a good result can be obtained by using only one vector, but for more complicated situations more vectors may be needed. The length of a state expansion vector depends on the requirements of pre-distortion. In other words, the number of terms depends on the needed quality of pre-distortion. Sometimes a good result can be obtained by using a short vector, but for more complicated situations the length of a vector can be increased.

Based on a frequency, bandwidth, power or another transmit chain variable, it is possible to use different settings within a state expander and to select different compensation parameter sets for both time- and frequency-domain pre-distortion.

In block 310, signal characterizing quantities are modified with at least one time-domain compensation parameter vector and with at least one frequency-domain compensation parameter vector to form a pre-distorted signal. Time-domain modification is typically done by multiplying predetermined signal characterizing quantities of one or more state expansion vectors with selected parameters of one or more time-domain compensation parameter vectors. Typically, the quantities multiplied are the amplitude and/or phase parameters. In a preferred embodiment of the invention, the time-domain pre-distortion is performed in a polar co-ordinate system. After time-domain compensation compensated parameters are combined in order to get one value per each parameter, for example, one phase value and one amplitude value per original data value.

The frequency-domain compensation is preferably performed by filtering a time-domain pre-emphasized signal value. The compensation filter structure typically comprises one or more filters or filter banks for compensating the non-linearities of a frequency response. This distortion is compensated by a filter. The frequency response of which is intended to be a mirror-image is compared with a transmission chain. The purpose is to linearize the frequency response of a transmission chain. In principle, the frequency response of the transmission chain can be equalized by forming an inverse filter by comparing the error between the transmit and feedback signals. Typically, a state expander controls the behavior and properties of the frequency domain pre-distortion.

In block 312, a feedback signal of the transmission chain output signal is formed. The linearized output signal of the transmission chain is fed back in order to adapt predistortion functions in time- and frequency-domain. The adaptation is directed at the time, frequency, amplitude- and/or phase-variance properties of a transmission chain. Preferably a feedback signal is formed in practice as follows: a linearized RF-output signal is supplied to a down-conversion part to obtain an intermediate frequency signal. This intermediate frequency signal is then supplied to an analog-to-digital converter (ADC) where it is sampled and converted into a digital signal, to which demodulation (for instance IQ-demodulation) is carried out. This, typically complex, digital signal is then supplied to adaptation routines, where the complex digital feedback signal is compared with the corresponding original complex input signal.

In block 314, the feedback signal is filtered to minimize the non-linearities of a frequency response caused in a down-conversion chain. This is carried out to improve the adaptation of both the time-domain compensation parameter vectors and frequency-domain compensation parameter vectors.

In block 316, one or more time-domain compensation parameter vectors are adapted. Preferably, for this purpose, signal values are fed back. Signal values after down-conversion and the corresponding original data signal values are compared. The pre-distortion function is adapted by changing a parameter vector on the basis of the comparison.

In block 318, one or more frequency-domain compensation parameter vector are adapted on the basis of the residual error between the transmit and feedback signals. Preferably, for this purpose, signal values are fed back for adapting the compensation filter structure. Signal values after down-conversion and the corresponding original data signal values are compared. On the basis of the result, the filter tap coefficients are determined to adjust the filter to better compensate frequency-domain distortion.

In block 320, the coefficients of the feedback filter are adapted similarly to frequency-domain compensation vector adaptation.

The method ends in block 322. The arrow 324 illustrates that it may be iterative.

Figure 4:
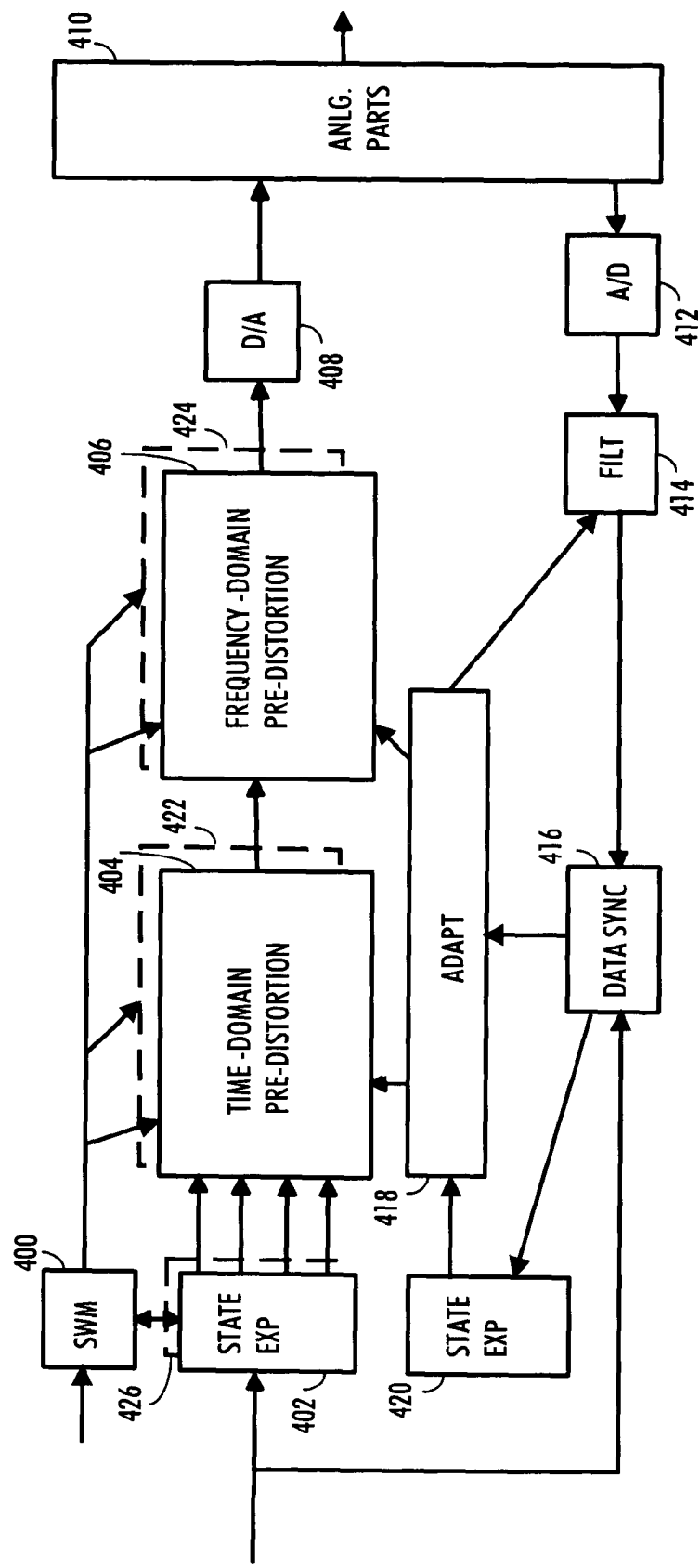
FIG. 4 is a block diagram of a part of a transmitter in accordance with an embodiment of the invention.

FIG. 4 illustrates a block diagram of a part of a transmitter according to an embodiment of the invention. FIG. 4 shows mainly the parts of a transmitter by which the pre-distortion (or pre-emphasizing) method described above can be implemented. It is obvious to a person skilled in the art that the transmitter structure can differ from what is depicted in FIG. 4. Block 400 is a switching matrix which examines for instance transmission power, frequency or bandwidth for selecting the suitable pre-distortion vectors and/or coefficients for different power levels, frequencies or bandwidths, for example. The different sets of vectors are marked in FIG. 4 by numbers 404, 422, 406, 424. The number of sets can vary.

Block 402 is a state expander which processes a signal for proper pre-distortion. A state expansion vector consists of quantities characterizing non-linearities as a function of selected signal properties. For instance, a state expansion vector is composed of a predetermined number of different powers of one or more amplitude values which are arranged in a vector. Another example is that a state expansion vector is composed of a predetermined number of different powers of an amplitude delayed by a predetermined number of samples. Yet another example is that a state expansion vector is formed from amplitude values which are processed in different ways: by differentiating, integrating, etc. It is also possible to combine amplitude values processed in different ways. Therefore, a state expansion vector can be composed of one or more powers of amplitude values, one or more powers of the derivative of an amplitude value, one or more integrated amplitude values and/or combined values, which can be called cross terms.

A state expander can be composed of filters and units which generate a predetermined number of values for each input value, for instance an amplitude value. A state expander can expand one signal value to a predetermined number of values. If the structure comprises filters, they are typically either Finite Impulse Response (FIR) or Infinite Impulse Response (IIR) filters. The output of a state expander is a vector including the required number of values characterizing a signal to be distorted.

The number of required state expansion vectors varies: sometimes good result can be obtained by using just one vector, but for more complicated situations more vectors may be needed. The length of a state expansion vector depends on the requirements of pre-distortion. In other words, the number of terms depends on the needed quality of pre-distortion. Sometimes good result can be obtained by using a short vector, but for more complicated situations the length of a vector can be increased.

It is also possible to use different state expansion vectors for different transmission frequencies, powers, bandwidths and/or other transmit chain variables, as shown in device 426 in FIG. 4.

Blocks 404, 422 depict time-domain pre-distortion blocks for different transmission power levels, transmission bandwidth, transmission frequency or other properties of a transmission chain.

The time-domain pre-distortion is performed using one or more time-domain compensation vectors. In this application, the term "vector" may also include matrix type vectors. A vector can also represent the coefficients of a polynomial or a spline. Time-domain compensation vectors are explained in more detail above.

Blocks 406, 424 in turn describe frequency-domain pre-distortion blocks for different transmission power levels, transmission bandwidth, transmission frequency or other property of a transmission chain. The frequency-domain pre-distortion is performed using one or more frequency-domain compensation parameter vectors. Frequency-domain vectors compensate for non-linearities of a frequency response of a transmit chain. The frequency-domain pre-distortion can be implemented as a filter, the frequency response of which is intended to be a mirror-image in comparison to the transmission chain. Typically, a state expander controls the behavior and properties of frequency-domain pre-distortion. In this case parameters of the compensation vector are tap coefficients and the length of the vector is determined by the length of the filter. Frequency-domain compensation vectors are also explained in more detail above.

Block 408 carries out digital-to-analog (D/A) conversion. D/A conversion is known in the art and is therefore not explained here in more detail.

Block 410 carries out the analog functions of a transmitter such as up- and down-conversions and power amplifying. These functions are known in the art and are therefore not explained in further detail.

Next, the feedback part of the transmitter is explained. The main purpose of the feedback chain is to offer information for adapting the pre-distortion vectors. This is done because the distortion changes as a function of time.

Block 412 is an analog-to-digital (A/D) converter. A/D conversion is known in the art and is therefore not explained here in more detail.

Block 414 is an adaptive filter or a filter bank. If there is a lot of gain and phase ripple in the feedback path, an additional compensation filter can also be placed at the output of a down-conversion chain before adaptation routines. The implementation structure is similar to what is used in the frequency-domain pre-distortion.

Block 416 is a data synchronizing block that synchronizes original data samples to correct feedback samples for adapting the compensation vectors and also for filter adapting, if required. It should be noted that the feedback processing of a signal requires time and thus the original signal samples may be delayed like the feedback signal values.

The structure of the second state expander 420 is similar to the first state expander 402. This state expander vector consists of corresponding or similar signal characterizing quantities as the first state expander used in pre-distortion. By analyzing the residual error in the feedback signal against this state expander vector, it is possible to adjust the time-domain compensation parameter vector or vectors for better performance.

Block 418 is an adaptation block which adapts both time-domain pre-distortion blocks 404, 422 and frequency-domain pre-distortion blocks 406, 424, if required. Also the feedback compensation filter 414 is also adapted in this block. This adaptation is required because of the time variance properties of non-linear devices. The adaptation is performed iteratively by adjusting the coefficients of the compensation vectors or the tap coefficients of the filters in order to find the best possible correspondence for the transmit chain transfer function. This is achieved by performing an adaptation which estimates the residual error between the original and feedback signal and then calculating the needed change in the coefficients to eliminate the error in question. In a preferred embodiment, the residual error is calculated for phase and amplitude separately, when it comes to adaptation of time-domain compensation parameter vectors. For the frequency-domain compensation parameter vector and feedback compensation filter the residual error is calculated preferably in a Cartesian co-ordinate.

The adaptation process of the time-domain compensation parameter vector typically minimizes the mean square error. There are several methods for minimizing the mean square error in the prior-art. These methods are not explained here in more detail. Just to mention a few examples: LMMSE (linear minimum mean square), MMSE (minimum mean square error) or Kalman filtering. Other suitable methods can also be used.

One objective of the adaptation of the frequency-domain compensation vectors is to linearize the frequency response of the transmission chain. The same methods used in the time-domain adaptation can be used for frequency-domain adaptation.

Figure 5:
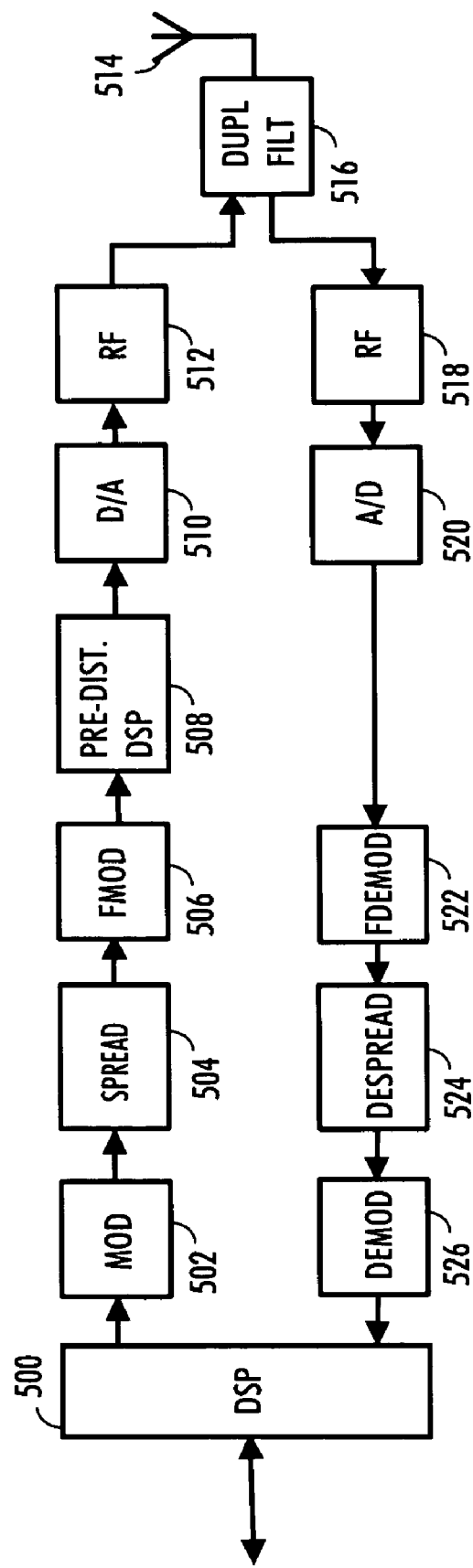
FIG. 5 shows an example of a base station transceiver in accordance with an embodiment of the invention.

A block diagram is shown in FIG. 5 to illustrate a transceiver to which the aforementioned methods can be applied. It is evident to a person skilled in the art that a transceiver can also comprise parts other than those shown in FIG. 5.

The digital signal-processing block 500 represents the parts of a transceiver that are required to form user speech or data in a transmitter. A signal, or a string of information consisting of symbols, i.e. one or more bits, is processed in the transmitter in different manners. The signal processing, which includes for example coding/decoding and encryption/decryption, is usually carried out in a digital signal processor (DSP). If the transmission in the system is carried out in frames, which consist of time slots, the frames are typically formed and symbols are interleaved in the DSP. The purpose of signal coding and interleaving is to ensure that the transmitted information can be restored in the receiver, even if all the information bits cannot be received. The Digital Signal Processing (DSP) block is shared by a receiver and a transmitter. Alternatively, separate DSP blocks can be provided for both, the receiver and transmitter.

In a transmitter, in block 502, the data signal is modulated by a desired modulation method. Modulation methods are known in the art and therefore they are not explained here in further detail. In the example shown in FIG. 5, the data modulator 502 implements a modulation method where the signal is divided into in-phase (I) and quadrature (Q) components. An example of such a modulation method is quadrature phase shift keying (QPSK) and modifications thereof, such as the offset QPSK method.

Because the system in FIG. 5 is a wide-band system, the signal is spread for example by multiplying it with a long pseudo-random code. An example of such a wide-band system is the UMTS. Spreading is performed in block 504. If the system is a narrow-band system the spreading block may not be required.

The modulation carried out in block 506 is related to multicarrier systems, for example, where different carriers are organized on the frequency domain in a manner applicable to the invention. It is thus possible to provide one transmitter with several carriers. The modulation in block 506 can be implemented using a prior-art manner. In FIG. 5, only one carrier is depicted for the sake of clarity.

In a preferred embodiment of the invention, the pre-distortion and/or adaptation is carried out in a separate pre-distortion DSP block 508. The feedback chain required for adaptation is not shown in FIG. 5 for the sake of clarity.

A signal is converted from a digital into an analog form in block 510. RF parts 512 up-convert the signal onto a selected transmission frequency either directly or by first converting the signal onto an intermediate frequency, whereafter the signal is amplified and filtered, if required. The antenna 514 can be either a single antenna or an array antenna consisting of several antenna elements. If both the transmitter and the receiver use the same antenna, a duplex filter 516 is needed to separate the signal to be transmitted from the signal to be received.

In a receiver, a received signal is down-converted, which is an inverse action of the up-conversion in block 518. Then the signal is converted from an analog form into a digital form in block 520.

Then, the signal is demodulated in block 522. The demodulation carried out in block 522 is related to multicarrier systems, for example, where different carriers must be separated in the frequency domain in a manner applicable to the currently used system. The demodulation in block 522 can be implemented in a prior-art manner. In FIG. 5, only one carrier is depicted for the sake of clarity.

If the system is a wide-band system, the received signal is a wideband signal which may need to be transferred into a narrow-band signal for further processing. The signal is despread for example by multiplying it with the same long pseudo-random code which was used the in spreading process. Despreading is performed in block 524.

Next, the signal is demodulated in block 526. This demodulation is sometimes called data demodulation. Demodulation methods are also known in the art and therefore they are not explained here in more detail. One objective of the demodulation is to remove the modulation performed in the transmitter.

The disclosed functionalities of the described embodiments of the data transmission method can be advantageously implemented by means of software which is typically situated in the digital signal processor. The implementation solution can also be for instance an ASIC (Application Specific Integrated Circuit) component. A hybrid of these different implementations is also feasible.

Even though the invention is described above with reference to an example according to the accompanying drawings, it is clear that the invention is not restricted thereto but it can be modified in several ways within the scope of the appended claims.

The invention claimed is:

1. A data transmission method for compensating for non-linearities of a transmission chain, the method comprising:
   first forming at least one time-domain compensation parameter vector;
   second forming at least one frequency-domain compensation parameter vector;
   determining at least one set of signal properties modeling the non-linearities in a transmission chain;
   third forming, based on the at least one set of signal properties, at least one state expansion vector comprising quantities characterizing a signal;
   modifying the signal characterizing quantities of at least one state expansion vector with the at least one time-domain compensation parameter vector and with the at least one frequency-domain compensation parameter vector to form a pre-distorted signal;
   fourth forming a feedback signal from an output signal of a transmission chain;
   first adapting the at least one time-domain compensation parameter vector based on a residual error between a transmit signal and the feedback signal; and
   second adapting the at least one frequency-domain compensation parameter vector based on the residual error between the transmit signal and the feedback signal.

2. The method of claim 1, wherein the step of said first forming further comprises selecting the compensation parameter vector based on at least one of a transmission power, a frequency, a bandwidth and another transmission chain property.

3. The method of claim 1, wherein the step of second forming further comprises at step of selecting the at least one frequency-domain compensation parameter vector based on at least one of a transmission power, frequency, bandwidth and another transmission chain property.

4. The method of claim 1, further comprising a step of selecting a state expander functions based on at least one of a transmission power, a frequency, a bandwidth and another transmission chain property.

5. The method of claim 1, wherein the step of said third forming the at least one state expansion vector further comprises a step of including a function selected from at least one of a function for memoryless pre-emphasizing, a function for dynamic pre-emphasizing, a function for weighted integral dynamic pre-emphasizing and a function for cross-term dynamic pre-emphasizing.

6. The method of claim 1, wherein the step of said first forming further comprises a step of searching at least one time-domain compensation parameter vector and the at least one frequency domain compensation parameter vector for predetermined signal properties.

7. The method of claim 1, further comprising a step of performing a time-domain pre-distortion in a polar coordinate system.

8. A data transmission method for compensating for non-linearities of a transmission chain, the method comprising:
   first forming at least one time-domain compensation parameter vector;
   second forming at least one frequency-domain compensation parameter vector;
   determining at least one set of signal properties modeling non-linearities in a transmission chain;
   third forming, based on the at least one set of signal properties, at least one state expansion vector comprising quantities characterizing a signal;
   modifying the signal characterizing quantities of at least one state expansion vector with the at least one time-domain compensation parameter vector and with the at least one frequency-domain compensation parameter vector to form a pre-distorted signal;
   fourth forming a feedback signal from an output signal of a transmission chain;
   filtering the feedback signal to minimize a non-linear frequency response of a feedback chain;
   first adapting the at least one time-domain compensation parameter vector based on a residual error between a transmit signal and the feedback signal,
   second adapting the at least one frequency-domain compensation parameter vector based on a residual error between a transmit signal and the feedback signal; and
   third adapting at least one compensation parameter vector of a feedback filter based on a residual error between the transmit signal and the feedback signal.

9. The method of claim 8, wherein the step of said third adapting further comprises a step of configuring compensation parameters of the at least one compensation parameter vector based on the residual error between the transmit signal and the feedback signal.

10. The method of claim 8, further comprising a step of performing time-domain pre-distortion and the step of adapting further comprises a step of performing the at least one time-domain compensation parameter vector in a polar coordinate system.

11. A transmitter for compensating for non-linearities of a transmission chain, the transmitter comprising:
   first forming means for forming at least one time-domain compensation parameter vector;
   second forming means for forming at least one frequency-domain compensation parameter vector;
   determining means for determining at least one set of signal properties modeling non-linearities in a transmission chain;
   third forming means for forming, based on the at least one set of signal properties, at least one state expansion vector comprising quantities characterizing a signal;
   modifying means for modifying the signal characterizing quantities of at least one state expansion vector with the at least one time-domain compensation parameter vector and with the at least one frequency-domain compensation parameter vector to form a pre-distorted signal;
   fourth forming means for forming a feedback signal from an output signal of a transmission chain;
   first adapting means for adapting the at least one time-domain compensation parameter vector based on a residual error between a transmit signal and the feedback signal; and
   second adapting means for adapting the at least one frequency-domain compensation parameter vector based on the residual error between the transmit and the feedback signal.

12. The transmitter of claim 11, further comprising selecting means for selecting the at least one time-domain compensation parameter vector based on at least one of a transmission power, a frequency, a bandwidth or another transmission chain property.

13. The transmitter of claim 11, further comprising selecting means for selecting at least one frequency-domain compensation parameter vector based on at least one of a transmission power, a frequency, a bandwidth or another transmission chain property.

14. The transmitter of claim 11, further comprising selecting means for selecting state expander functions based on a transmission power, a frequency, a bandwidth or another transmission chain property.

15. The transmitter of claim 11, further comprising searching means for searching the at least one time-domain compensation parameter vector and the at least one frequency-domain compensation parameter vector for predetermined signal properties.

16. The transmitter of claim 11, further comprising distorting means for performing a time-domain pre-distortion in a polar coordinate system.

17. A transmitter for compensating for non-linearities of a transmission chain, the transmitter comprising:
   first forming means for forming at least one time-domain compensation parameter vector;
   second forming means for forming at least one frequency-domain compensation parameter vector;
   determining means for determining at least one set of signal properties modeling the non-linearities in a transmission chain;
   third forming means for forming, based on the at least one set of signal properties, at least one state expansion vector comprising quantities characterizing a signal;
   modifying means for modifying the signal characterizing quantities of at least one state expansion vector with the at least one time-domain compensation parameter vector and with the at least one frequency-domain compensation parameter vector to form a pre-distorted signal;
   fourth forming means for forming a feedback signal from an output signal of a transmission chain;
   filtering means for filtering the feedback signal to minimize a non-linear frequency response of a feedback chain;
   first adapting means for adapting the at least one time-domain compensation parameter vector based on a residual error between a transmit signal and the feedback signal;
   second adapting means for adapting the at least one frequency-domain compensation parameter vector based on the residual error between the transmit signal and the feedback signal; and third adapting means for adapting at least one compensation parameter vector of a feedback filter based on the residual error between the transmit signal and the feedback signal.

18. The transmitter of claim 17, further comprising fourth adapting means for adapting compensation parameters of the at least one compensation parameter vector based on the residual error between the transmit signal and the feedback signal.

19. The transmitter of claim 17, further comprising distorting means for performing a time-domain pre-distortion and fourth adapting means for adapting the at least one time-domain compensation parameter vector in a polar coordinate system.

20. A transmitter for compensating for non-linearities of a transmission chain, the transmitter being configured to:
   form at least one time-domain compensation parameter vector;
   form at least one frequency-domain compensation parameter vector;
   determine at least one set of signal properties modeling the non-linearities in a transmission chain;
   form, based on the at least one set of signal properties, at least one state expansion vector comprising quantities characterizing a signal;
   modify the signal characterizing quantities of at least one state expansion vector with the at least one time-domain compensation parameter vector and with the at least one frequency-domain compensation parameter vector to form a pre-distorted signal;
   form a feedback signal from an output signal of a transmission chain;
   adapt the at least one time-domain compensation parameter vector based on a residual error between a transmit signal and the feedback signal; and
   adapt the at least one frequency-domain compensation parameter vector based on the residual error between the transmit signal and the feedback signal.

21. A transmitter for compensating for non-linearities of a transmission chain, the transmitter being configured to:
   form at least one time-domain compensation parameter vector;
   form at least one frequency-domain compensation parameter vector;
   determine at least one set of signal properties modeling the non-linearities in a transmission chain;
   form, based on at least one set of signal properties, at least one state expansion vector comprising quantities characterizing a signal;
   modify the signal characterizing quantities of at least one state expansion vector with the at least one time-domain compensation parameter vector and with the at least one frequency-domain compensation parameter vector to form a pre-distorted signal;
   form a feedback signal from an output signal of a transmission chain;
   filter the feedback signal to minimize a non-linear frequency response of a feedback chain;
   adapt the at least one time-domain compensation parameter vector based on a residual error between a transmit and the feedback signal;
   adapt the at least one frequency-domain compensation parameter vector based on the residual error between the transmit signal and the feedback signal; and
   adapt at least one coefficient of a feedback filter based on the residual error between the transmit signal and the feedback signal.

22. A base station, wherein non-linearities of a transmission chain are compensated for, the base station comprising:
   first forming means for forming at least one time-domain compensation parameter vector;
   second forming means for forming at least one frequency-domain compensation parameter vector;
   determining means for determining at least one set of signal properties modeling nonlinearities in a transmission chain;
   third forming means for forming, based on the at least one set of signal properties, at least one state expansion vector comprising quantities characterizing a signal;
   modifying means for modifying the signal characterizing quantities with the at least one time-domain compensation parameter vector and with the at least one frequency-domain compensation parameter vector to form a pre-distorted signal;
   fourth forming means for forming a feedback signal from a transmission chain output signal;
   first adapting means for adapting the at least one time-domain compensation parameter vector based on a residual error between a transmit signal and the feedback signal; and
   second adapting means for adapting the at least one frequency-domain compensation parameter vector based on the residual error between the transmit signal and the feedback signal.

23. A base station, wherein nonlinearities of a transmission chain are compensated for, the base station comprising:
   first forming means for forming at least one time-domain compensation parameter vector;
   second forming means for forming at least one frequency-domain compensation parameter vector;
   determining means for determining at least one set of signal properties modeling the nonlinearities in a transmission chain;
   third forming means for forming, based on the at least one set of signal properties, at least one state expansion vector comprising quantities characterizing a signal;
   modifying means for modifying the signal characterizing quantities with the at least one time-domain compensation parameter vector and with the at least one frequency-domain compensation parameter vector to form a pre-distorted signal;
   fourth forming means for forming a feedback signal from an output signal of a transmission chain;
   filtering means for filtering the feedback signal to minimize a non-linear frequency response of a feedback chain;
   first adapting means for adapting the at least one time-domain compensation parameter vector based on a residual error between a transmit signal and the feedback signal;
   second adapting means for adapting the at least one frequency-domain compensation parameter vector based on the residual error between the transmit signal and a feedback signal; and
   third adapting means for adapting at least one compensation parameter vector of a feedback filter based on the residual error between the transmit signal and the feedback signal.

* * * * *